United States Patent [19]

Chern et al.

[11] 4,033,286

[45] July 5, 1977

[54] CHEMICAL VAPOR DEPOSITION REACTOR

[75] Inventors: Shy-Shiun Chern, Los Angeles; Joseph Maserjian, La Crescenta, both of Calif.

[73] Assignee: California Institute of Technology, Pasadena, Calif.

[22] Filed: July 12, 1976

[21] Appl. No.: 704,468

[52] U.S. Cl. .............................. 118/49; 23/252 R; 427/95, 248, 253; 423/335, 337, 349;

[51] Int. Cl.² ..................... C23C 11/08; B05D 5/12

[58] Field of Search ............ 23/252 R, 277 R, 284; 427/95, 248, 255; 423/335, 337, 349; 118/48–49.5; 148/174, 175; 13/22, 25; 219/385

[56] References Cited

UNITED STATES PATENTS

| | | | |
|---|---|---|---|
| 3,293,074 | 12/1966 | Nickl | 148/175 UX |
| 3,341,374 | 9/1967 | Sirtl | 148/174 X |
| 3,481,781 | 12/1969 | Kern | 427/95 |
| 3,525,595 | 8/1970 | Zirngibl et al. | 23/277 R X |
| 3,641,974 | 2/1972 | Yamada et al. | 118/48 |
| 3,696,779 | 10/1972 | Murai et al. | 118/48 |
| 3,717,439 | 2/1973 | Sakai | 23/252 R X |

*Primary Examiner*—Morris O. Wolk
*Assistant Examiner*—Roger F. Phillips
*Attorney, Agent, or Firm*—Eric T. S. Chung

[57] ABSTRACT

An improved chemical vapor deposition reactor is characterized by a vapor deposition chamber configured to substantially eliminate non-uniformities in films deposited on substrates by control of gas flow and removing gas phase reaction materials from the chamber. Uniformity in the thickness of films is produced by having reactive gases injected through multiple jets which are placed at uniformly distributed locations. Gas phase reaction materials are removed through an exhaust chimney which is positioned above the centrally located, heated pad or platform on which substrates are placed. A baffle is situated above the heated platform below the mouth of the chimney to prevent downdraft dispersion and scattering of gas phase reactant materials.

6 Claims, 8 Drawing Figures

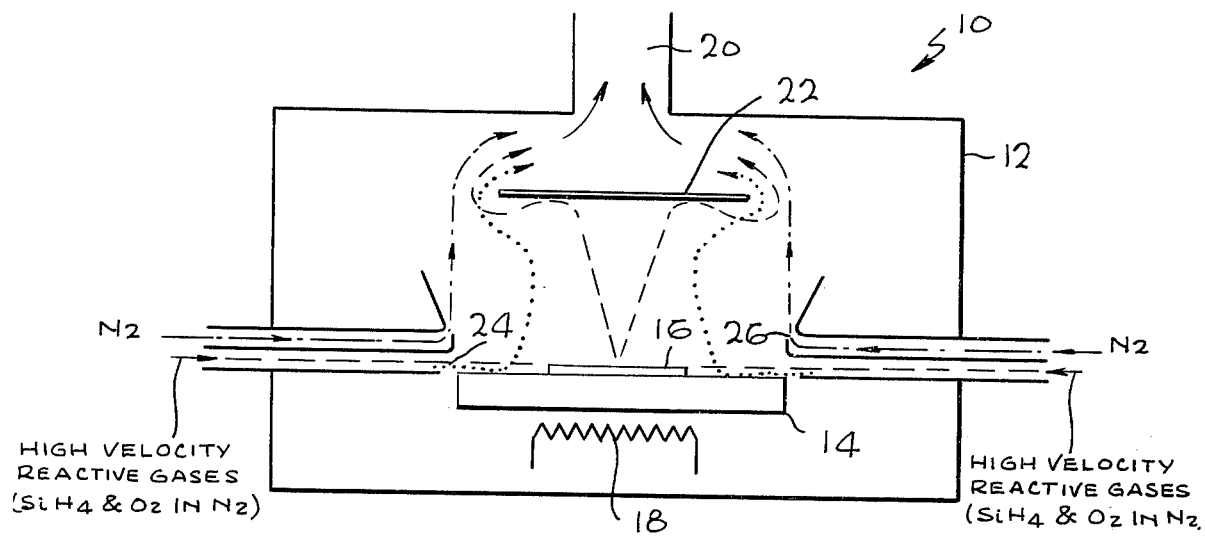
Fig.1
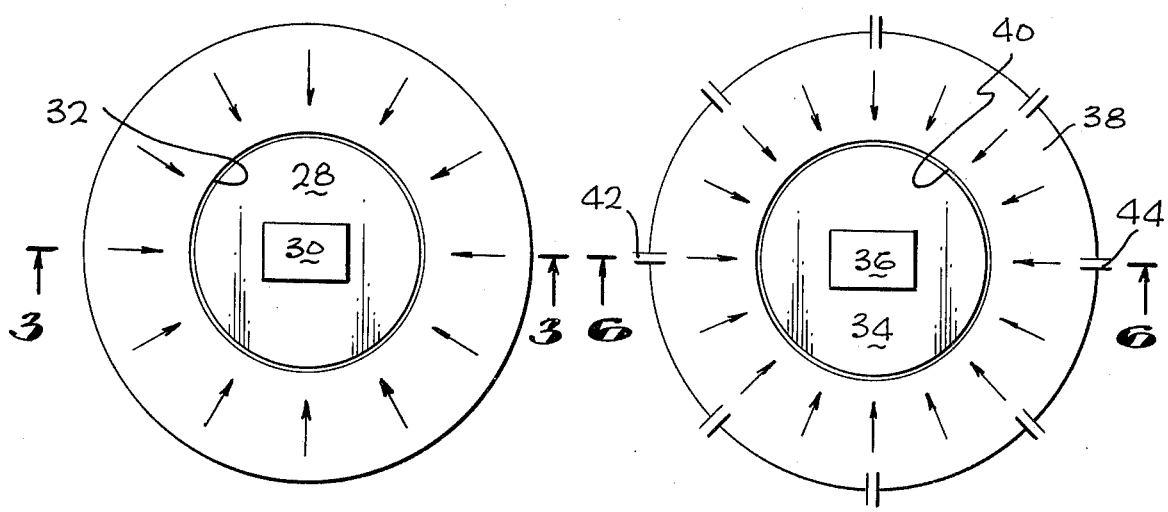
Fig.2
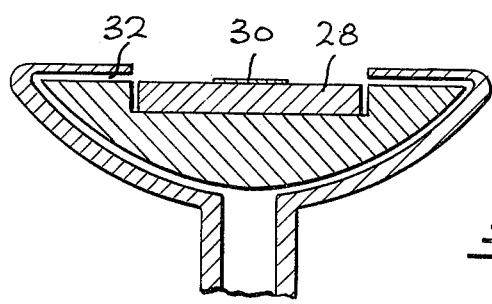
Fig.3
Fig.4

CHEMICAL VAPOR DEPOSITION REACTOR

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 USC 2457).

BACKGROUND OF THE INVENTION

1. Field of the Invention

This invention is generally related to vapor deposition reactors that are useful for chemical vapor deposition procedures. More specifically, the present invention concerns an improved reactor which is designed to eliminate snowing of gas phase growth reactants on a workpiece to eliminate the non-uniform deposition of films on substrates and to have balanced injection of reactive gases to form films of uniform thickness.

2. Description of the Prior Art

A thin film material can be deposited from a vapor. Such chemical vapor deposition processes include the forming of film, such as silicon, silicon dioxide, silicon nitride, and aluminum oxide on a substrate. As a typical example, dielectric films of silocon dioxide are widely used in the fabrication of planar microelectronics, particularly in MOS technology for selective masking, electric field isolation, and gate insulation. Several processes are available for growing silicon dioxide films on silicon. The thermally grown process produces excellent silicon dioxide films, but is only suitable for growing thin gate oxides.

Previous efforts at chemical vapor deposition processes involved the thermal decomposition of silane into free silicon for oxidation by free oxygen gas mixed with silane. This reaction can be carried out at much lower temperatures thean the thermally grown process, but as presently practiced, the oxide films are often defective. The defects often result fom inclusions of large particles in an otherwise fine grained film. Furthermore, such films also have variations in such properties as thickness, etch rate, and charge distribution properties.

In a chemical vapor deposition process for the deposition of silicon dioxide, the reactive gases typically are a mixture of 0.003 percent to 0.8 percent silane and 0.01 percent to 10.0 percent oxygen in a non-reactive carrier gas such as nitrogen, which makes up the balance of the processing gas. This gas mixture is introduced into a reactor containing a substrate upon which the silicon dioxide is to be deposited. The substrate is heated to cause the reaction. When the heated silane dissociates, silicon atoms, which are released from the hydrogen bonds, are in a very active state in which they seek to reestablish other bonds. Since there is free oxygen present, the silicon atoms combine with the oxygen atoms to form silicon dioxide molecules. Ideally, the newly formed silicon dioxide molecules come into contact with the surface of the substrate, and unsatisfied oxygen atom bonds attach to atoms already on the surface of the substrate to produce a stable structure. Deposited atoms form a base upon which other silicon dioxide molecules can deposit so that a fine grained structure is built up. However, if the newly formed silicon dioxide molecules come into contact with other silicon dioxide molecules in the gas before reaching the surface of the substrate, the molecules in the gas join up. As more are encountered, the molecules continue to attach and grow to form large particles. Such particules land on the surface like snow and form a coarse, porous and granular structure. The result is that 10 percent nonuniformity is presently considered acceptable and as being the best than can be accomplished. Such results are not appropriate for purposes which require uniform film thickness.

One of the causes of such growth in the gas phase into large particles is a premature gas phase reaction. If the silane gas stream has been sufficiently heated before reaching the vicinity of the substrate, dissociation occurs followed by formation of silicon dioxide molecules which attach to each other rather than deposit on the substrate because the silicon dioxide molecules are not directly adjacent the substrate. Accordingly, for the foregoing and other reasons related to the character of the reaction, it is desirable that a chemical vapor deposition reactor be created to permit uniform deposition so that improved characteristics result.

OBJECTS AND SUMMARY OF THE INVENTION

Accordingly, it is an object of the present invention to provide a chemical vapor deposition reactor which reacts an incoming gas stream and deposits the results on a substrate in an even and dense manner.

It is another object to provide a chemical vapor deposition reactor which eliminates premeature gas phase reaction and eliminates the various gradients which are responsible for nonuniform film growth.

It is a further object to provide a chemical vapor deposition reactor which eliminates the snowing effect of molecules out of the vapor onto the substrate by appropriately removing the unreacted gas from the region of the substrate.

In order to aid in the understanding of this invention, it can be stated in essentially summary form that it is directed to a vapor deposition reactor which provides at least two streams of reactive gas across the substrate to provide uniform reactive gas concentrations across the substrate and to remove unreacted gas away from the substrate to provideuniform deposition.

The features that characterize the novelty of the present invention are set forth with particularity in the appended claims. Both the organization and manner of operation of the invention, as well as other objects and the attendant advantages thereof, may be best understood by reference to the following detailed description taken in conjunction with the accompanying drawings wherein like reference symbols designate like parts throughout the figures therein.

BRIEF DESCRIPTION OF THE DRAWINGS

FIG. 1 is a transverse section through the center of an improved chemical vapor deposition reactor in accordance with the present invention.

FIG. 2 is a plan view of the hot plate and the surrounding novel structure of a first embodiment of a circular chemical vapor deposition reactor.

FIG. 3 is a section taken generally along the line 3—3 of FIG. 2.

FIG. 4 is a plan view of a second embodiment of a circular reactor, showing reactive gas introduction through a plurality of nozzles.

Figure 5:
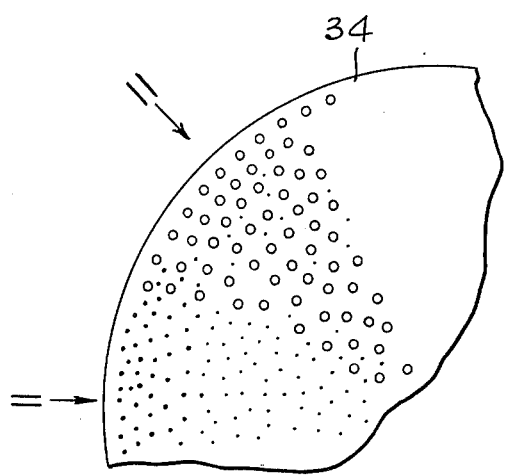
FIG. 5 is a schematic diagram, with parts broken away, showing the distribution of gases from two adjacent reactive gas nozzles.

DESCRIPTION OF THE PREFERRED EMBODIMENT.

The chemical vapor deposition reactor 10 illustrated in schematic cross section in FIG. 1 solves the uniform deposition problem by eliminating premature gas phase reaction, eliminating the various gradients which are responsible for nonuniform film growth, and removing effluent gases from the region of the substrate to eliminate snowing on the substrate. Reactor 10 includes structure which accomplishes these results. The structure comprises housing 12 in which is located hot plate 14. A substrate 16 is positioned on the hot plate 14 for the deposition of material thereon from the vapor. A heater 18 maintains the hot plate and the substrate thereon at a desired temperature using any convenient conventional means, such as a thermostatic control.

It should be noted that the hot plate 14 is sufficiently thick to provide a large thermal storage to provide uniform heating of the substrate and to minimize the cooling effect of the incoming gas. The heater 18 is positioned to provide uniform heating of the hot plate.

A chimney exhaust 20 with a baffle 22 provides for continuous exhaust of the effluent gas from the reactor with sufficient velocity such that the effluent gas is drawn above the baffle before particles formed in the gas stream are able to precipitate onto the substrate.

Reactive gases are supplied at a rate that allows avoidance of any backflow of effluent gas to prevent the snowing of particles onto the substrate from the effluent gas phase, as described above. The supply of fresh gas effects replenishment of the reactive gases by replacing the components which are reacted into film formation. This also improves film uniformity.

Referring to FIG. 1, reactive gases are supplied through inlet nozzles which are situated in the plane of the substrate to have gases directed at the substrate 16. A curtain gas nozzle 26 is positioned to provide a curtain of non-reactive gas, such as nitrogne gas, directly above the reactive gas inlets to prevent any possible backflow of effluent due to free convection. Such use of a non-reactive curtain gas thus optimizes the effective exhausting of the effluent gas from the reactor by causing additional gas flow out of the chimney.

The chimney at the top of the reactor provides free exhaust to the atmosphere or to appropriate waste collector. The temperature gradient between the hot plate and the region immediately above it will further cause gas to rise upwardly to flow out of the chimney. The baffle 22 serves to prevent dispersal and/or scattering of the gas phase reactants onto the substrate 16. The baffle does not impede outflow. Preferably, the chimney may be connected to a suction source having negative pressure to produce a positive and effective exhaust.

The reactor structure of FIG. 1 could either be circular or rectangular in configuration. FIGS. 2 and 3 illustrate a circular configuration wherein hot plate 28 carrying its substrate 30 is surrounded by a circular reactive gas nozzle 32. The nozzle provides uniform inwardly directed radial flow, as indicated by the flow arrows in FIG. 2, to provide uniform gas concentration of reactive gases flowing across the substrate. Of course, the radial inflow from all directions results in out-flowing of effluent; however, the converging radial inflow also provides fresh reactive gas, with the radial configuration of flow providing the necessary uniformity of reactive gas components. The uniform input of reactive gas in a complete circle is accomplished by the circular nozzle 32.

As it is seen in FIG. 4, gas enters the inlet at the bottom and spreads uniformly around the spherical diffuser into which the hot plate is recessed, as illustrated. The uniform velocity flow of the gas across the hot plate is indicated by the vectors of FIG. 2.

Figure 6:
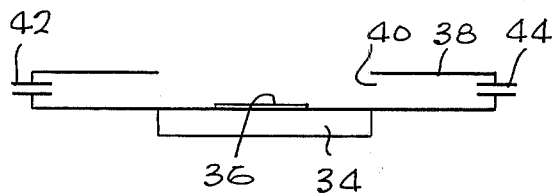
FIG. 6 is a section taken generally along the line 6—6 of FIG. 4 showing the manner in which the gas velocity distribution is achieved.

FIGS. 4 and 6 illustrate another nozzle arrangement, which FIG. 5 illustrates the character of the gas flow which is obtained by that nozzle construction. Again, the reactor is provided with a circular hot plate 34, on which a substrate 36 is placed. A circular diffuser 38 has a radially inwardly directed opening 40 through which reactive gas is projected across the hot plate 34 and across the substrate 36 thereon. Jet nozzles are arranged around the outer wall of the diffuser, with jet nozzles 42 and 44 illustrated in FIG. 6. As illustrated in FIG. 4, eight nozzles may be used. The gas flow velocity at the nozzles is as expected higher than the gas flow velocity out of the diffuser between the nozzles. The intermediate flows of reactive gas aid in mixing of the radially inwardly flowing gas stream.

FIG. 5 schematically illustrates the distribution of reactive gas from two adjacent jet nozzles. FIG. 5 graphicaly deomonstrates how the concentration of reactive gas is maintained across the hot plate 34 and hence a substrate 36 is supported thereon.

Figure 7:
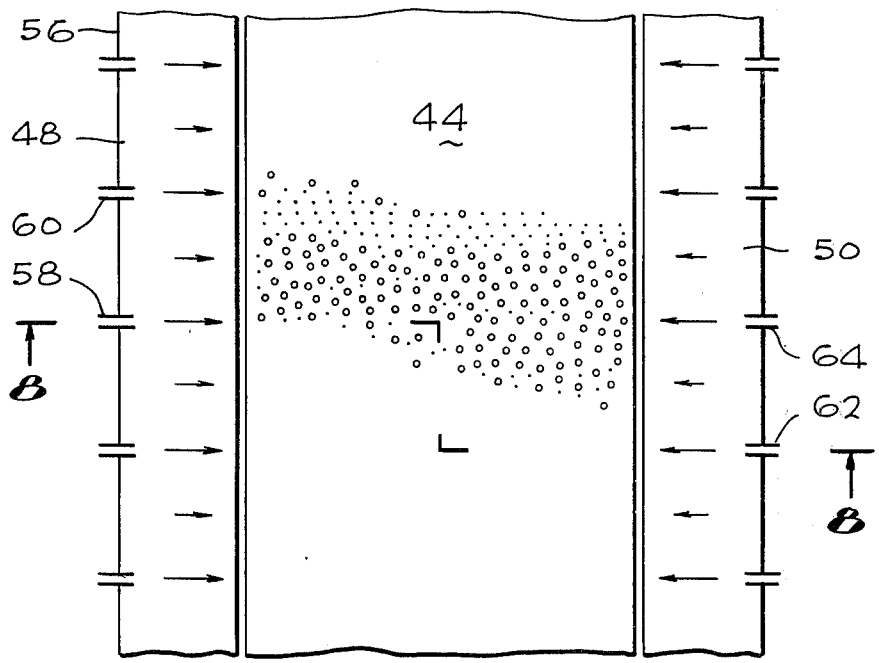
FIG. 7 is a plan view, with parts broken away, of the chemical vapor deposition reactor of FIG. 1, where the reactor is configured as a rectangular device, and showing the distribution of reactive gases from opposed jet inlet nozzles.
Figure 8:
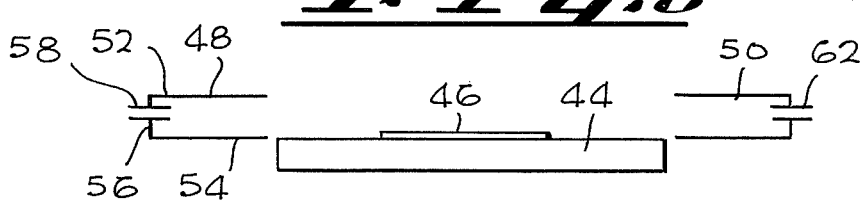
FIG. 8 is a section taken generally along the line 8—8 of FIG. 7, showing the jet inlet nozzle structure and adjacent reactive gas-handling passages.

FIGS 7 and 8 illustrate a rectangular configuration of the reactor which achieves a somewhat similar opposed gas flow. As shown, the reactor of FIG. 7 incudes a hot plate 44 on which a substrate 46 is supported. The elongate shape of the hot plate 44 has the advantage of accomodating a plurality of substates along the length thereof. Diffusers 48 and 50 are located along opposite edges of the hot plate. the diffusers have parallel top and bottom plate 52 and 54 with a closed outer wall 56. A plurality of jet nozzles is positioned through outer wall 56, with two nozzles illustrated at 58 and 60. A similar set of jet nozzles is positioned through the outer wall of diffuser 50, with two of them indicated at 62 and 64. A source of reactive gas is connected to the jet nozzles as to each jet nozzle provides a gas stream into the diffuser and through the diffuser out over the hot plate in a lateral direction. It is noted that jet nozzle 58 is positioned between jet nozzles 62 and 64. A similar relationship is established for the other jet nozzles situated in the diffusers 48 and 50. The purpose of the diffuser 48 and 50 is to somewhat diffuse the flow of gas from the jet nozzles; but maintain a turbulent pattern to cause mixing of gases as illustrated in FIG. 7.

This arrangement of jets and diffusers also provides a distribution of reactive gases across the entire length of hot plate 44 with fresh reactive gases being supplied all across the surface for uniform reaction and deposition.

As earlier mentioned, the distribution of gases is schematically illustrated by dots and circles in FIG. 7 and it is seen that the higher velocity at the mouth of the jets results in a gas being distributed across the width of the hot plate 44. The large vector arrows indicate the main thrust of each jet, and the smaller arrows are intended to indicate lesser gas flows due to adjacent jets. The patterns of circles and dots in FIGS. 5 and 7 indicate a representative inter-mixture of reactive gases when injected in the fashion above-described.

Summarizing, in all cases, the reactive input gases are fed through a diffuser gap which is formed by two horizontaly disposed sheet directors placed one above the other, with the lower sheet arranged to be aligned with the top surface of the hot plate. If the upper sheet is spaced a very small distance, on the order of about 0.002 inch (0.05 mm) above the lower sheet, the set of jets indicated in FIGS. 4 and 7 is not necessary; however, the production of such a narrow gap is difficult and costly, and thus the diffuser structure of FIGS. 4 and 7 is more practical. In that structure, the gap is in the oder of 0.10 inch (2.5 mm), and there is a spacing of about 2 inches (50 mm) between the gas inlets and the outlet of the diffuser. The use of the jet nozzles into this space shapes the emerging gas flow into a thin sheet which directs more of the reactive gas directly to the surface of the substrate. This stucture minimizes gas consumption and at the same time, provides for uniform distribution.

The nitrogen flow described with respect to FIG. 1 is also introduced in he structure of FIGS. 2, 4 and 7 by means of a gap which is disposed immediately above the reactive gas inlet gap. This structure may be arranged so that the top plate of the diffuser serves as the lower plate of the nitrogen gap. In any case, the lower wall of the nitrogen gap is shaped as indicated in FIG. 1 to direct the nitrogen flow upwardly to form a gas custain which generally confines the flow of the reactive gas to an area immediately above the hot plate. In this way, uniformity of reactive gas distribution is achieved, and reacted gas is promptly removed from the area adjacent the substrate.

While the preferred embodiment of the present invention has been described hereinabove, it is intended that all matter contained in the above description and shown in the accompanying drawings be interpreted as illustrative and not in a limiting sense and that all modifications, constructions and arrangments which fall within the scope and spirit of the invention may be made.

What is claimed is:

1. A chemical vapor deposition reactor comprising:
   a housing;
   a horizontaly oriented heating platform positioned within said housing, said platform having an upper surface on which substrates are positioned;
   an exhaust from said housing, said exhaust including an outlet chimney position over said heating platform for receiving and removing effluent gases from adjacent said heating platform;
   a baffle positioned over said heating platform and beneath said outlet chimney, said baffle being a planar member positioned in parallel alignment with the upper surface of said heating platform;
   reactive gas inlet means positioned adjacent said heating platform along the edge of said heating platform for directing reactive gases over the top of said heating platform and across a substrate positioned thereon to have reactive gases flow toward the center of said heating platform from said edge thereof; and
   curtain gas inlet means situated adjacent and over said reactive gas inlet means for providing a curtain of non-reactive gas to prevent backflow of said effluent gases.

2. The chemical vapor deposition reactor defined by claim 1 wherein said heating platform is a hot plate which is generally circular and said reactive gas inlet means is positioned around said circular hot plate to have reactive gases flow radiallyinward across said hot plate.

3. The chemical vapor deposition reactor defined by claim 2 wherein said reactive gas inlet means is an annular opening.

4. The chemical vapor deposition reactor defined by claim 3 wherein said reactive gas inlet means includes a diffuser having a discharge portion and a plurality of reactive gas inlet jets connected to said diffuser for supplying reactive gases to said diffuser for flow through said diffuser and radially onto said heating platform.

5. The chemical vapor deposition reactor defined by claim 1 wherein said heating platform is a hot plate which is substantially rectangular and said reactive gas inlet means includes a plurality of inlet jets positioned adjacent opposite edges of said hot plate to direct reactive gases across said hot plate.

6. The chemical vapor deposition reactor defined by claim 5 wherein said reactive gas inlet jets are offset from each other on opposite sides of said hot plate.

* * * * *